United States Patent [19]

von Trebra et al.

[11] Patent Number: 5,609,945
[45] Date of Patent: Mar. 11, 1997

[54] PARTIALLY TRANSLUCENT WHITE FILM HAVING METALLIZED SURFACE

[75] Inventors: Robert J. von Trebra, Flemington, N.J.; Gerald A. Smith, Easton, Pa.; Roy E. Hensel, Cranbury; Oliver A. Barton, deceased, late of Florham Park, both of N.J., by Marjorie Barton, executrix

[73] Assignee: Bayer Corporation, Pittsburgh, Pa.

[21] Appl. No.: 536,889

[22] Filed: Sep. 29, 1995

Related U.S. Application Data

[60] Continuation of Ser. No. 184,081, Jan. 18, 1994, abandoned, which is a division of Ser. No. 87,953, Jul. 6, 1993, Pat. No. 5,300,395, which is a division of Ser. No. 497,227, Mar. 22, 1990, Pat. No. 5,246,812.

[51] Int. Cl.⁶ .......................... B32B 15/08; G03C 1/805; G03C 1/825; G03C 1/77
[52] U.S. Cl. .......................... 428/209; 428/195; 428/203; 428/215; 428/336; 428/457; 428/914; 430/259; 430/358; 430/524; 430/950
[58] Field of Search .................................. 428/461, 918, 428/914, 480, 195, 199, 203, 209, 215, 333, 457, 458, 38, 34, 336; 430/257, 523, 524, 526, 950, 961, 259, 9, 11, 18, 14, 15, 17, 143, 358

[56] References Cited

U.S. PATENT DOCUMENTS

| | | | |
|---|---|---|---|
| 3,700,449 | 10/1972 | Lerner | 96/48 PD |
| 3,798,034 | 3/1974 | Laridon | 96/15 |
| 3,975,197 | 8/1976 | Mikelsons | 96/86 R |
| 4,076,889 | 2/1978 | Sasaki et al. | 428/333 |
| 4,210,712 | 7/1980 | Munger et al. | 430/275 |
| 4,215,168 | 7/1980 | Yonemura et al. | 428/215 |
| 4,262,071 | 4/1981 | Larson | 430/11 |
| 4,348,453 | 9/1982 | Cohen | 428/333 |
| 4,489,154 | 12/1984 | Taylor, Jr. | 430/253 |
| 4,511,641 | 4/1985 | Basman et al. | 430/158 |
| 4,579,810 | 4/1986 | Johnson et al. | 430/293 |
| 4,659,642 | 4/1987 | Platzer et al. | 430/143 |
| 4,735,892 | 4/1988 | Orpwood et al. | 430/323 |
| 4,820,611 | 4/1989 | Arnold, III et al. | 430/271 |
| 4,895,787 | 1/1990 | Platzer | 430/253 |
| 4,948,693 | 8/1990 | Shadrach et al. | 430/143 |
| 4,978,572 | 12/1990 | Akao | 428/323 |
| 5,246,812 | 9/1993 | von Trebra | 430/253 |

FOREIGN PATENT DOCUMENTS 53-144986  5/1977  Japan.

OTHER PUBLICATIONS

Section Ch, Week 8610, Mar. 1986, Derwent Publ., Ltd., London, GB; Class A08, AN 86–065461 & JP–A–61 016 968 Jan. 86.

Section Ch, Week 8223, Jun. 1982, Derwent Publ. Ltd., London, GB; Class A12, AN 82–47056E & JP–A–57 070 647 May 82.

Section Ch, Week 8107, Feb. 1981, Derwent Publ., Ltd., London, GB; Class A12, AN 82–47056E & JP–A–55 158 962 Dec. 80.

Primary Examiner—Paul J. Thibodeau
Assistant Examiner—Vivian Chen
Attorney, Agent, or Firm—Richard S. Roberts; Andrew F. Sayko, Jr.; Palaiyur S. Kalyanaraman

[57] ABSTRACT

An image-bearing element comprising of a white, translucent, metallized film article wherein the film article comprises a flexible, heat resistant, polymeric film material with opposite sides. The film material has deposited on a first side a metal coating which both reflects and transmits visible light and capable of transmitting from about 1% to about 70% of incident visible light cast thereon. The second side of the film material has a white outermost surface and has a visible light opacity of from about 0.5 to about 0.98.

20 Claims, 3 Drawing Sheets

| METALLIZED COATING | -2 |
|---|---|
| WHITE POLYESTER SHEET | -4 |

| METALLIZED COATING | —2 |
|---|---|
| WHITE POLYESTER SHEET | —4 |

FIGURE 1

| METALLIZED COATING | —2 |
|---|---|
| TRANSPARENT POLYESTER SHEET | —6 |
| ADHESIVE LAYER | —8 |
| WHITE POLYESTER SHEET | —4 |

FIGURE 2

| METALLIZED COATING | —2 |
|---|---|
| TRANSPARENT POLYESTER SHEET | —6 |
| WHITE COATING | —10 |

FIGURE 3

| METALLIZED COATING | −2 |
| TRANSPARENT POLYESTER SHEET | −6 |
| ADHESIVE LAYER | −8 |
| TRANSPARENT POLYESTER SHEET | −6 |
| WHITE COATING | −10 |

FIGURE 4

| METALLIZED COATING | −2 |
| WHITE POLYESTER SHEET | −4 |
| IMAGE | −12 |

FIGURE 5

PARTIALLY TRANSLUCENT WHITE FILM HAVING METALLIZED SURFACE

This application is a continuation of Ser. No. 08/184,081 filed on Jan. 18, 1994, now abandoned; which is a divisional of Ser. No. 08/087,953 filed on Jul. 6 1993, now U.S. Pat. No. 5,300,395; which is a divisional of Ser. No. 07/497,227 filed on Mar. 22, 1990, now U.S. Pat. No. 5,246,812.

BACKGROUND OF THE INVENTION

The present invention relates to partially translucent, white films having a metallized surface. More particularly, the invention relates to flexible sheet articles having a highly reflective surface, and have the ability to partially and controlledly transmit diffuse light therethrough.

In the art of color proofing, color separations made from an original image should represent a faithful reproduction of tonal values, and the proofing methods used to make representations of these halftone separations should reproduce the quality seen in the photomechanically produced originals. However, when these high quality color proofing separations are compared to the output of a high quality printing press, the results do not always correspond. This lack of correspondence is the result of the printing press producing a halftone dot size on paper that is different from the halftone dots on the printing plate, or color separation itself. The observable result is what is called in the trade as "dot gain". It is produced by the spreading out of ink on the printed sheet to cover an area different than is represented by the printing plate or color proofing originals. These problems have been recognized in the printing industry and certain techniques have been developed to adjust for these variations. Color proofing systems are well known and are broadly disclosed in the prior art. The techniques of progressing from an original colored artwork through a series of color separations, and the use of these separations to generate color proofing separations are well known in the art.

In the art of printing, it is desirable to produce a multicolor proof to assist a printer in correcting a set of color separations which will be used in exposing a series of expensive lithographic printing plates. The proof should reproduce the color quality that will be obtained during the printing process. The proof must be a consistent duplicate of the desired half tone or line image. Visual examination of a color proof should reveal the color rendition to be expected from a press using the color separations, and any defects on the separations which might need to be altered before making the printing plates.

Color proofs for multicolored printing can be made by using a printing press which is known as a proof press. This requires that all of the actual printing steps be formed and this conventional method of color proofing is costly and time consuming. Alternate color proofing methods have therefore been developed to simulate the quality of press proofs. There are two general types of photoimaging methods, namely the overlay type and the single sheet type. In the overlay color proofing system, an independent transparent plastic support is used for producing a colored image of each color separation film. A number of such supports carrying the various colored images of cyan, yellow, magenta and black are then superimposed upon each other and placed on a white sheet to produce a color proof. Examples of this approach are described in U.S. Pat. Nos. 3,136,637; 3,211,553; and 3,326,682. In the single sheet color proofing method, a color proof is prepared by successively producing images of the colors from different color separation films onto a single receiver sheet. This is done by using a single opaque support and by applying toners, photosensitive solutions, or coatings of photosensitive materials of corresponding colors to the opaque support in succession. Examples of this approach are described in U.S. Pat. Nos. 3,671,236; 4,260,673; 4,366,223; 4,650,738; 4,656,114; and 4,659,642. An advantage of the single sheet type of color proof is that the color is not influenced by superimposed plastic supports. This method more closely resembles actual printing and eliminates the color distortion inherent in the overlay system. Various processes for producing copies of an image embodying photopolymerization and thermal transfer techniques are known as shown in U.S. Pat. Nos. 3,060,023; 3,060,024; 3,060,025; 3,481,736; and 3,607,264. In these processes, a photopolymerizable layer coated on a support is imagewise exposed through a color separation. The surface of the exposed layer is then pressed into contact with the image receptor sheet and the composite is heated to a temperature above the transfer temperature of the unexposed portions of the layer. The two elements are then separated, and the image areas transferred to the image receptor. U.S. Pat. No. 3,721,557 shows a method of transferring colored images to a receptor sheet. An image carrying support is pressed against a suitable adhesive coated receptor member and subsequently, the carrier support sheet is stripped to accomplish the transfer of the image. A fresh layer of adhesive is applied to the receptor for each subsequent transfer. U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet.

Images can also be produced by a peel apart method. Peel apart color proofing systems are known to the skilled artisan per se. Peel apart methods are described in U.S. Pat. No. 4,489,154, where a photosensitive layer is disposed between two self supporting sheets. Upon exposure, there is an imagewise differential in adhesion of the exposed and unexposed portions of the photosensitive image to one of the two sheets forming the photosensitive element.

It has been found that to various extents, the substrate on which the final image appears, contributes to an increase in apparent dot gain on the proof. This is disadvantageous since it contributes to the production of an image which is not a faithful reproduction of the original image. The prior art has recognized this problem and has sought to achieve a receiver base for image transfer which does not increase apparent dot gain. To this end, U.S. Pat. No. 4,579,810 discloses a multicolor proof having a pearlescent support. It has now been found that dot gain can be controlled using a partially translucent support which is white on one side and has a spectrally reflective, mirror-like metallic surface on the opposite side. The white side allows an accurate reflective background base from which to view the colors of the image. White backgrounds, while themselves well known in the art are also transmissive to part of the light cast upon them. Since the background materials, usually white polyester films, have a certain thickness, they tend to reflect part of this transmitted light back through the image in a diffuse fashion and cause a shadow which is viewed as a gain in dot size. This invention solves this problem by coating the opposite side of the support with a mirror-like metallic coating. This causes the inevitable reflections to be much more coherent rather than diffuse, thereby substantially reducing shadow and hence dot gain. In the first instance one would assume that the same result could be attained by employing a base which is completely opaque. However, it has been found that in order to correctly register sequential image separated halftone images as is necessary in color proofing, the receiver support must have a certain degree of translucency. The present invention therefore provides an improved white receiver base for color proofing images which possesses the requisite degree of translucency for image registration and yet has substantially reduced apparent dot gain.

SUMMARY OF THE INVENTION

The present invention provides a white, partially translucent, metallized film article which comprises a flexible, heat resistant, polymeric film material having first and second opposite sides, said film material having deposited on a first side thereof a metal coating which is spectrally reflective and partially light transmissive in the visible region of the spectrum, said coating having a thickness of from about 10 angstroms to about 200 angstroms, a specular gloss of about 90 or more; and being capable of transmitting from about 1% to about 70% of incident visible light cast thereon; the second side having a white outermost surface, said second side having a visible light opacity of from about 0.5 to about 0.98. The invention also provides an element which comprises the aforesaid article and an image on the white side of it.

The invention further provides a white, partially translucent, metallized film article which comprises a flexible, heat resistant, polymeric film material having deposited on one side thereof a metal coating which is spectrally reflective and partially light transmissive in the visible region of the spectrum, said metal coating having a thickness of from about 10 angstroms to about 200 angstroms, a specular gloss of from about 90 or more; and being capable of transmitting from about 1% to about 70% of incident visible light cast thereon; and the opposite side of the metal coating having a white surface thereon, said white surface having a visible light opacity of from about 0.5 to about 0.98. The white surface can be either a white coated layer on the metal coating or a white polymeric film sheet. Optionally there can be an adhesive between the metal coating and the white polymeric film sheet. These articles may be used to produce elements which comprise an image disposed on white surface.

The invention also provides a method of producing a positive color proofing image having reduced dot gain which comprises:

(A) providing a photosensitive element which comprises, in order:
  (i) a transparent support preferably having an adhesion promoted surface; and
  (ii) a photosensitive composition layer on said adhesion promoted surface, which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and
  (iii) an adhesive layer directly adhered to said colored, photosensitive layer, which adhesive layer comprises a thermoplastic resin which has a $T_g$ in the range of from about 25° C. to about 100° C.; and providing a receiver base which is a white, partially translucent, metallized film article which comprises a flexible, heat resistant, polymeric film material having first and second opposite sides, said film material having deposited on a first side thereof a metal coating which is spectrally reflective and partially light transmissive in the visible region of the spectrum, said coating having a thickness of from about 10 angstroms to about 200 angstroms, a specular gloss of about 90 or more; and being capable of transmitting from about 1% to about 70% of incident visible light cast thereon; the second side having a white outermost surface, said second side having a visible light opacity of from about 0.5 to about 0.98; and (B) either
  (i) laminating said adhesive layer to said receiver base at elevated temperature and pressure; and then image-wise exposing said photosensitive composition through the transparent support to actinic radiation; or
  (ii) image-wise exposing said photosensitive composition to actinic radiation; and then laminating said adhesive layer to said receiver base at elevated temperature and pressure; and (C) peeling apart said support and said receiver base, thereby transferring the adhesive layer and the image-wise nonexposed portions of the colored, photosensitive composition to the receiver base while the image-wise exposed portions remain on the adhesion promoted surface of the support; and (D) optionally repeating steps (A) through (C) at least once with another photosensitive element having at least one different colorant transferred to the adhesive layer and image-wise nonexposed portions of the previously processed photosensitive element on said receiver base.

The invention also provides an improved method for forming a colored image which comprises:

A. providing a receiver base which is a white, partially translucent, metallized film article which comprises a flexible, heat resistant, polymeric film material having first and second opposite sides, said film material having deposited on a first side thereof a metal coating which is spectrally reflective and partially light transmissive in the visible region of the spectrum, said coating having a thickness of from about 10 angstroms to about 200 angstroms, a specular gloss of from about 90 or more; and being capable of transmitting from about 1% to about 70% of incident visible light cast thereon; the second side having a white outermost surface, said second side having a visible light opacity of from about 0.5 to about 0.98; and B. providing a photosensitive element which comprises in order:
  i) a substrate having a release surface; and
  ii) a photosensitive layer on said release surface, which photosensitive layer comprises a light sensitive component selected from the group consisting of negative working, polymeric diazonium compounds or positive working quinone diazide compounds or photopolymerizable compositions in an amount sufficient to photosensitize the layer; and a resinous binder composition in an amount sufficient to bind the layer components into a uniform film; and at least one colorant in an amount sufficient to uniformly color the layer; and iii) an optional, nonphotosensitive, colorless adhesive layer directly adhered to said colored photosensitive layer, which adhesive layer has a softening point in the range of from about 60° C. to about 180° C.; and C. either i) laminating said photosensitive element with heat and pressure via said photosensitive or adhesive layer of the photosensitive element to one side of said receiver sheet composite; and removing said substrate by the application of peeling forces; and imagewise exposing said photosensitive layer to actinic radiation; or ii) imagewise exposing said photosensitive layer to actinic radiation; and laminating said photosensitive element with heat and pressure via said photosensitive or adhesive layer of the photosensitive element to one side of said receiver sheet composite; and removing said substrate by the application of peeling forces; or iii) laminating said photosensitive element with heat and pressure via said photosensitive or adhesive layer of the photosensitive element to one side of said receiver sheet composite; and imagewise exposing said photosensitive layer to actinic radiation; and removing said substrate by the application of peeling forces; and thereafter D. removing the nonimage areas of said photosensitive layer with a liquid developer, which removing is conducted at a temperature at which said photosensitive element is substantially nontacky; and thereafter E. optionally repeating steps (A) through (D) at least once whereby another photosensitive element having at least one different colorant is laminated onto the nonremoved portions of the previously processed photosensitive layer or layers on the receiver sheet composite.

The invention also provides the photosensitive articles which are produced by the aforesaid methods.

BRIEF DESCRIPTION OF THE DRAWINGS

FIG. 1 shows one embodiment of the inventive film article wherein a metallized coating appears on an integral white polyester sheet.

FIG. 2 shows another embodiment of the invention where the article comprises two sheets adhered together. The white sheet is an integral white polyester sheet and the other sheet is transparent and has the metallized coating.

FIG. 3 shows yet another embodiment of the invention where the article has a transparent polyester sheet with a metallized coating on one side and a white coating on the other side.

FIG. 4 still another embodiment of the invention where the article comprises two sheets adhered together. These are a first transparent polyester sheet with a metallized coating on one side and a second transparent polyester sheet having a white coating on one side.

FIG. 5 shows an image on the white side of the article appearing in FIG. 1.

DETAILED DESCRIPTION OF THE PREFERRED EMBODIMENT

Figure 6:
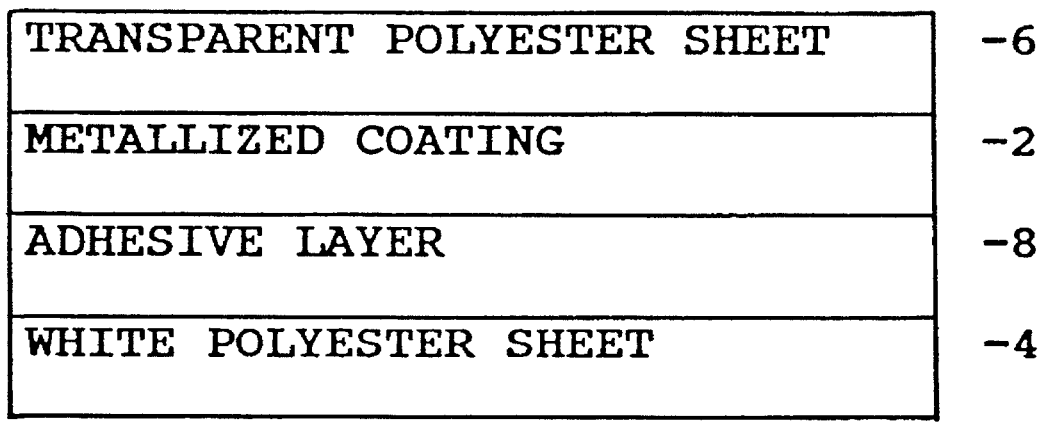
FIG. 6 shows an embodiment of the invention where the article comprises two sheets adhered together. The white sheet is an integral white polyester sheet and the other sheet is transparent and has the metallized coating. The adhered white polyester sheet is on the metallized coating.

In the usual full color proof, four distinct colored images are formed, namely cyan, yellow, magenta, and black. When the images are superimposed upon each other, a simulated full color reproduction results. One begins the process of the present invention by preparing a receiver sheet as mentioned above and then forming an image on it. Preferably the image is formed by laminating, exposing and developing a colored, photosensitive layer on the receiver sheet.

The main support of the film may comprise virtually any material flexible, self-supporting, heat resistant, polymeric film which can withstand the laminating and wet or dry development processes usual in the photographic arts. In the preferred embodiment, the substrate is composed of a dimensionally and chemically stable base material which does not significantly change its size, shape, or chemical properties as the result of the heating, coating, or other treatments which it must undergo. Polyester sheets are preferred and polyethylene terephthalate is most preferred. In the usual case it has a thickness of from about 1 to about 10 mils, a more preferred thickness is from about 2 to about 5 mils, and most preferably from about 2 to about 3 mils. As mentioned before, in certain embodiments, the polyester sheet is transparent. Suitable films include Hostaphan 3000, available from Hoechst Celanese Corporation; Hostaphan 4400, 4500, and 4540 available from Hoechst AG. Mylar D, available from DuPont; and Melinex 516, 054, 504,505, 582, available from ICI. They may have subbing layers. Examples of adhesion pretreatment subbing layers are disclosed in U.S. Pat. No. 2,627,088. In other embodiments, the support is an integral white plastic sheet. Melinex 939 polyester from ICI, is useful for this purpose. This is basically a customarily produced polyethylene terephthalate film where a white colorant is incorporated into the polymer melt before extrusion and biaxial orientation.

In the embodiment of FIG. 1, there is shown an integral white white polyester sheet 4, which has a metallized coating 2 disposed on one surface of sheet 4. Metallization processes are well known in the art. Typically, a metal such as aluminum is vapor deposited or otherwise applied onto one side of the sheet. One vapor deposition technique is disclosed in U.S. Pat. No. 4,333,983 which is incorporated herein by reference. Metallized films may be those which are available commercially from Madico in Woburn Mass., or Martin Processing in Martinsville, Va.

The metal coating has a thickness of from about 10 angstroms to about 200 angstroms, or more preferably from about 20 angstroms to about 80 angstroms and most preferably from about 20 angstroms to about 30 angstroms. The metal layer on the substrate has a specular gloss of from about 90 or more, preferably from about 95 or more and most preferably from about 99 or more as measured by a gloss meter. The metal layer is capable of transmitting from about 1% to about 70%, more preferably about 5% to about 50% and most preferably about 10% to about 20% of incident visible light cast thereon.

FIG. 2 shows another embodiment of the invention wherein a transparent polyester sheet 6 having a metallized coating 2 is adhered by a suitable adhesive 8 to a white polyester sheet 4.

The films are adhered by a pressure or heat sensitive adhesive layer. The adhesive is preferably colorless and developer resistant. This layer comprises a major amount of one or more thermoplastic polymers. Virtually any thermoplastic polymer may be used for this purpose. Suitable thermoplastic polymers nonexclusively include vinyl acetal resins such as Butvar B-79 available from Monsanto; acrylic resins such as Elvacite 2044 available from DuPont; ethylene resins such as Elvax 210 available from DuPont; ethylene/vinyl acetate copolymers such as Elvax 40-W and 150-W available from DuPont; and vinyl chloride resins such as Hostaflex CM 133 available from Hoechst AG. Preferably the polymer is a vinyl acetate polymer or copolymer. The two films are merely adhered to each other to form the composite.

In the embodiment disclosed in FIG. 3, a transparent polyester sheet 6 is provided with a metallized coating 2, and a white coating 10. The white coating may be any appropriate paint emulsion which is capable of producing the aforesaid optical characteristics.

FIG. 4 shows an embodiment having a transparent polyester sheet 6 with a metallized surface adhered by adhesive layer 8 to another transparent polyester sheet 6 having a white coating 10. Among the embodiments of FIGS. 1 though 4, clearly the embodiment of FIG. 1 is the most preferred for its simplicity of construction. Also, since a goal of the invention is to reduce dot gain caused by dot shadows which is caused by diffusion and reflection through the substrate, the fewer the layers, the less diffusion. The second side having the white outermost surface, has a visible light opacity of from about 0.5 to about 0.98, more preferably from about 0.7 to about 0.98 and most preferably about 0.85 to about 0.97.

FIG. 5 shows the construction of FIG. 1 which bears an image 12. In the usual case, image 12 actually comprises a series of four or more image separated image portions. The image may be produced by any of several methods known in the art for image transfer, full layer or peel apart processing. The most preferred image preparation methods are those described in U.S. Pat. No. 4,650,738 and 4,659,642 which are incorporated herein by reference. These methods relate to positive and negative working photographic elements which broadly comprise a photographic element which is a colored photosensitive layer on a temporary support and an adhesive layer on the photosensitive layer. The element is laminated to the receiver, the temporary support removed and exposed in any order, and then developed. In the usual case another photographic element having another color is then applied to the previous image.

FIG. 6 shows an embodiment of the invention where the article comprises two sheets adhered together. The white sheet 4 is an integral white polyester sheet and the other sheet 6 is transparent and has the metallized coating 2. The white polyester sheet 4 is adhered on the metallized coating 2 by an adhesive layer 8.

Figure 7:
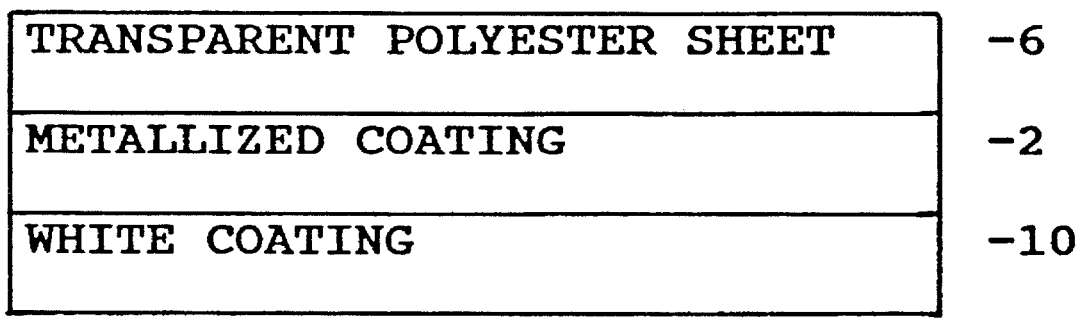
FIG. 7 shows another embodiment of the invention where the article has a transparent polyester sheet with a metallized coating on one side and a white coating on the metallized coating.

FIG. 7 shows embodiment of the invention where the article has a transparent polyester sheet 6 with a metallized coating 2 on one side and a white coating 10 on the metallized coating.

In preparing a photosensitive element, the photosensitive layer broadly comprises a photosensitizer, a colorant, a binding resin, and other optional ingredients such as plasticizers, stabilizers, surfactants, antistatic compositions, uv absorbers, photoactivators, antihalation agents, hydrogen atom donors, exposure indicators, optical brighteners, inert fillers, polymerization inhibitors, spectral sensitizers, and residual coating solvents.

In one embodiment, photosensitizer is preferably a light sensitive, negative working polymeric diazonium salt. The most preferred photosensitizer is the polycondensation product of 3-methoxy-4-diazo-diphenylamine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, the photosensitizer is preferably a light sensitive, naphthoquinone diazide. The most preferred photosensitizer is the ester of bis-(3-benzoyl-4,5,6-trihydroxy phenyl)-methane and 2-diazo-1-naphthol-5-sulfonic acid as taught in U.S. Pat. No. 4,407,426. Other suitable photosensitizers are taught in U.S. Pat. No. 4,266,001; 3,106,365; 3,148,983 and 3,201,239. The diazo compounds of choice are preferably soluble in organic solvents.

In yet another embodiment, the photosensitizer comprises a photopolymerizable monomer or oligomer component, and a photoinitiator. Examples of such photosensitizers are given in U.S. Pat. No. 4,596,757. The photopolymerizable material contained in the colored layer usually comprises an addition polymerizable, nongaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these pigments are products of Hoechst AG. They can be used separately or blended for a desired color.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Dyes may be included to spectrally sensitize the photoinitiator, such as described in U.S. Pat. Nos. 4,282,309 and 4,454,218, and European Patent Applications 0,179,448 and 0,211,615.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5 to about 70 percent by weight; more preferably from about 10 to about 50 percent by weight.

In the practice of the present invention, when a photoinitiator compound is used, it is preferably present in the photosensitive layer in a amount sufficient to initiate the free radical polymerization of the unsaturated component upon exposure to imaging energy. It is preferably present in an amount ranging from about 2% to about 30% based on the weight of the solids in the layer. A more preferred range is from about 6% to about 20%.

In the practice of the present invention, the colorant component is preferably present in an amount sufficient to uniformly color the photosensitive layer. It is preferably present in an amount ranging from about 5% to about 50% based on the weight of the solids in the layer. A more preferred range is from about 10% to about 40%.

In the practice of the present invention, when an unsaturated component is used, it is preferably present in the photosensitive layer in an amount sufficient to cause an imagewise latent differential in the polymerizable composition when it is coated on a substrate and imagewise exposed to imaging energy. It is preferably present in an amount ranging from about 10% to about 60% based on the weight of the solids in the layer. A more preferred range is from about 15% to about 40%.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid.

Exposure indicators (or photoimagers) which may be useful in conjunction with the present invention include 4-phenyl-azodiphenylamine, eosin, azobenzene, Calcozine Fuchine, Crystal Violet, and Methylene Blue dyes. Preferably, the exposure indicator is 4-phenylazodiphenylamine.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate, and acrylated amines.

A plasticizer may also be included in the composition of this invention to prevent coating brittleness to keep the composition pliable if desired. Suitable plasticizers include dibutylphthalate, dioctylphthalate, triarylphosphate and substituted analogs thereof.

To form a coating composition for the production of the photosensitive elements, the composition of this invention may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate.

However, some insignificant amount of solvent may remain as residue.

In the preferred embodiment, the photosensitive layer has a coating weight between approximately 0.1 and 5.0 g/m$^2$. The most preferred weight is from about 0.5 to 2.0 g/m$^2$.

The purpose of the optional adhesive layer on the photosensitive layer is to aid in the transfer of the photosensitive layer and to protect the integrity of underlying, previous formed images during development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The optional adhesive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer. Useful polyvinyl acetates nonexclusively include Mowilith DM-6, DM-22, 20, 25, 30 and mixtures thereof, available from Hoechst AG. These are usually dispersed in water, or dissolved in methyl isobutyl ketone or n-butyl acetate or other solvent compositions for coating on the photosensitive layer. It is then dried to a coating weight of from about 2 to about 30 g/m$^2$, more preferably from about 4 to about 20 g/m$^2$. The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS ½, available from Hercules. The adhesive layer should not be tacky to the touch, during storage or during development of the photosensitive element. The layer should be transferable in the range of from about 60° C. to 180° C., preferably 60° C. to 120° C., more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations for the photosensitive element nonexclusively include.

|      |                  |       |
|------|------------------|-------|
| I.   | Water            | 50.00 |
|      | Mowilith DM-22   | 50.00 |
| II.  | n-butyl acetate  | 78.00 |
|      | Resoflex R-296   | 1.00  |
|      | Mowilith 30      | 21.00 |
| III. | n-butyl acetate  | 68.70 |
|      | Uvinul D-50      | 1.30  |
|      | Mowilith 20      | 30.00 |
| IV.  | n-butyl acetate  | 85.00 |
|      | Mowilith 60      | 15.00 |

In operation, the photosensitive element is laminated to one side of the receiver sheet composite via the photosensitive layer or adhesive layer of the photosensitive element if present. Lamination may be conducted by putting together the photosensitive element and receiver sheet composite in the proper configuration and then introducing the two materials into the nip of a pair of heated laminating rollers under suitable pressure. Suitable laminating temperatures usually range from about 60° C. to about 180° C., preferably about 60° C. to about 120° C. After lamination, the substrate is peeled away, usually merely employing manual peeling forces. The photosensitive layer plus the adhesive layer of the photosensitive element when used thus remains on top of the composite.

The photosensitive layer is imagewise exposed by means well known in the art either before or after lamination. Such exposure may be conducted by exposure to a uv light source through a color separation under vacuum frame conditions. Exposures after lamination and support removal are preferred for emulsion-to-photosensitive layer contact. Mercury vapor discharge lamps are preferred over metal halide lamps. Other radiation sources, such as carbon arc, pulsed xenon, and lasers, may also be used. Light absorbing filters may be used to reduce light scattering in the material.

After transfer and exposure, the photosensitive layer is developed by dissolving the nonimage areas in a suitable developer and dried. Suitable developers nonexclusively include:

|      |                        | Weight Percent |
|------|------------------------|----------------|
| I.   | water                  | 95.0           |
|      | sodium decyl sulphate  | 3.0            |
|      | disodium phosphate     | 1.5            |
|      | sodium metasilicate    | 0.5            |
| II.  | water                  | 89.264         |
|      | monosodium phosphate   | 0.269          |
|      | trisodium phosphate    | 2.230          |
|      | sodium tetradecyl sulfate | 8.237       |

Any developer solution which satisfactorily removes the nonimage areas of the photosensitive layer after exposure while retaining the image areas may be used. The selection of developer is well within the ability of the skilled artisan. Development is performed at temperatures below that at which the photosensitive element is nontacky.

The process can then be repeated whereby another photosensitive element having a different color is laminated to the same receiver sheet composite over the previously formed image. In the usual case, four colored layers are employed to produce a full color reproduction of a desired image. These are cyan, magenta, yellow and black. Optionally one can laminate a protective layer over the thusly produced image.

In another embodiment of the invention, the image is formed by a dry peel apart development. In the peel apart method, after lamination of the photosensitive and adhesive layers and its support to the receiver base and after exposure of the photosensitive layer, the photosensitive layer is dry developed by stripping the support from the receiver base at room temperature with a steady, continuous motion. The preferred peel angle relative to the peel direction is greater than 90°. The delamination leaves the photoexposed areas on the temporary support and the nonexposed areas on the adhesive layer. The adhesive layer remains with the receiver base. Thus, an image with the adhesive remains on the receiver base. Another photosensitive layer is laminated via another adhesive to the first image on the receiver base. The second photosensitive layer has a different color than the first and is exposed through the appropriate color separation. After lamination to the receiver and exposure, the temporary support of the second photosensitive layer is removed as was done with the first support. The second image with its adhesive remains with the first image. A third and a fourth image may be added in a manner similar to that used to produce the second image. In the usual case, four colored layers are employed to produce a full color reproduction of a desired image. These four colors are cyan, magenta, yellow, and black.

The following nonlimiting examples serve to illustrate the invention.

EXAMPLE 1

A receiver base for a color proof is constructed by coating metallized polyester film (20% visible light transmission) with an adhesive solution of 20% Mowilith 30, 1% Resoflex, and 79% n-butyl acetate by weight. The adhesive is dried and a white polyester film (Melinex 994/200 from ICI) is laminated to the adhesive with heat and pressure. Another substrate is made by coating adhesive on Enco Pressmatch Standard Receiver Base (available from Hoechst Celanese Corporation, Somerville, N.J.) and laminating Melinex 994/200 to this material as before. Pressmatch (Hoechst Celanese) negative proofs are made on these two receiver bases, as well as on Pressmatch (Hoechst Celanese) standard receiver base using recommended procedures, exposing each color with an UGRA Plate Control Wedge. Dot gain measurements are made for each color in the final proof with a Cosar 61 densitometer. The results are summarized in the following table:

| Substrate | Color | | | |
|---|---|---|---|---|
| | M | Y | C | K |
| | Dot Gain at 40% Tint | | | |
| 994/200 on metallized polyester | 22% | 22% | 23% | 27% |
| 994/200 on Standard Receiver | 25% | 22% | 24% | 28% |
| PRESSMATCH Standard Receiver | 25% | 23% | 25% | 29% |
| | Dot Gain at 80% Tint | | | |
| 994/200 on metallized polyester | 11% | 11% | 11% | 13% |
| 994/200 on Standard Receiver | 11% | 11% | 11% | 13% |
| PRESSMATCH Standard Receiver | 12% | 11% | 12% | 14% |

EXAMPLE 2

A substrate for a color proof is made by coating metallized polyester film (20% visible light transmission) with a 4% weight solution of polyvinyl alcohol in water with a #8 wire wound rod. A white pigment dispersion composed of 40% titanium dioxide pigment, 5% Aquanal P-1 resin and 55% solvent (butyrolactone and Dowanol PM) by weight is coated on top of the polyvinyl alcohol coating with a #10 wire wound rod. The opacity of the white coating is determined to be 0.88. Pressmatch Negative color proofs are made on this substrate and on Pressmatch standard receiver base, exposing each color with a UGRA Plate Control Wedge in the recommended manner. Dot gain is measured for each color in the final proof at the 40% and 80% tint patches with a Cosar 61 densitometer. The results are summarized in the following table:

| Substrate | Color | | | |
|---|---|---|---|---|
| | M | Y | C | K |
| | Dot Gain at 40% Tint | | | |
| White dispersion on metallized film | 22% | 22% | 23% | 28% |
| PRESSMATCH Standard Receiver | 24% | 24% | 27% | 30% |
| | Dot Gain at 80% Tint | | | |
| White dispersion on metallized film | 10% | 10% | 10% | 13% |
| PRESSMATCH Standard Receiver | 11% | 12% | 12% | 14% |

EXAMPLE 3

A peel development positive color proofing system is made by coating the following four color solutions on adhesion promoted clear polyester film (Melinex 505 from ICI):

| Composition (parts by weight) | Yellow | Magenta | Cyan | Black |
|---|---|---|---|---|
| Tetrahydrofuran | 200 | 200 | 200 | 200 |
| Dowanol PM | 400 | 400 | 400 | 400 |
| Diacetone alcohol | 150 | 150 | 150 | 150 |
| Sartomer 399 | 12 | 8 | 8 | 12 |
| RB 779 | 4 | 4 | 4 | 4 |
| Formvar 12/85 | 4 | 1 | 1 | — |
| Yellow Formvar dispersion | 150 | — | — | — |
| Magenta Formvar dispersion | — | 200 | — | — |
| Cyan Formvar dispersion | — | — | 100 | — |
| Black Formvar dispersion | — | — | — | 200 |
| Coating density (densitometer) | 0.98 | 1.33 | 1.28 | 1.60 |

A separate adhesive film is prepared by coating Mowilith 30 adhesive solution as in Example 1 directly on slip treated polyester film (Melinex 516 from ICI).

A substrate is prepared by coating metallized polyester film (20% visible light transmission) with a Mowilith 30 adhesive solution on the metal side as in Example 1 above. A sheet of Melinex 994/200 white polyester film is laminated to the dried adhesive at 170° F. Four color proofs are prepared on this substrate and on Pressmatch standard receiver base by laminating a layer of the Mowilith 30 adhesive to the proofing substrate and then peeling off the Melinex 516 carrier sheet. A piece of the magenta color film is laminated to the adhesive layer and then exposed through a UGRA Plate Control Wedge through the Melinex 505 polyester film. After exposure, the clear Melinex 505 is peeled away, leaving a positive image. The following layers are applied, imaged and developed similarly. A Pressmatch Gloss cover sheet is applied to the final proof. The dot gain is measured at the 40% and 80% tint patches with a X-Rite 418 densitometer. The results are summarized in the following table:

| Substrate | Color | | | |
|---|---|---|---|---|
| | M | Y | C | K |
| | Dot Gain at 40% Tint | | | |
| Melinex 994/200 on metallized film | 15% | 14% | 19% | 23% |
| PRESSMATCH STANDARD Receiver | 18% | 20% | 25% | 28% |
| | Dot Gain at 80% Tint | | | |
| Melinex 994/200 on metallized film | 10% | — | 11% | 12% |
| PRESSMATCH Standard Receiver | 11% | 11% | 13% | 14% |

EXAMPLE 4

Four color proofs are made as in Example 3, except the proofs are made on Melinex 052 clear polyester as the substrate. A Pressmatch Transfer Gloss cover sheet is applied to the finished proof and the proofs are peeled off of the Melinex 052 receiver base. The proofs are then laminated to the same 2 substrates as in Example 3 and the temporary support is peeled from the cover sheet. The dot gain is again measured on the two supports as in Example 3. The results are as follows:

| Substrate | Color | | | |
|---|---|---|---|---|
| | M | Y | C | K |
| | Dot Gain at 40% Tint | | | |
| Melinex 994/200 on metallized film | 18% | 21% | 20% | 22% |
| PRESSMATCH STANDARD Receiver | 21% | 22% | 25% | 25% |
| | Dot Gain at 80% Tint | | | |
| Melinex 994/200 on metallized film | 11% | 11% | 12% | 13% |
| PRESSMATCH Standard Receiver | 12% | 11% | 14% | 14% |

What is claimed is:

1. An image-bearing element which comprises a white translucent, metallized film article, wherein the article comprises a flexible, heat resistant, polymeric film material having first and second opposite sides, said film material having deposited on a first side thereof a metal coating which is both light reflective and light transmissive in the visible region of the spectrum, wherein said coating has a thickness of from about 10 angstroms to about 200 angstroms, a specular gloss of from about 90 or more, and is capable of transmitting from about 1% to about 70% of incident visible light cast thereon; and wherein of said film material the second side has a white outermost surface, said second side having a visible light opacity of from about 0.5 to about 0.98, and having an image on the outermost surface of the second side.

2. The element of claim 1 wherein said polymeric film material comprises a single transparent polymeric film sheet and a white coating forming said white outermost surface of said second side.

3. The element of claim 2 wherein the image is a halftone image comprising halftone dots.

4. The element of claim 1 wherein said polymeric film material comprises a white polymeric film sheet which is white throughout its entirety.

5. The element of claim 4, wherein the image is a halftone image comprising halftone dots.

6. The element of claim 1 wherein said polymeric film material comprises first and second polymeric film sheets adhered at an interface and said first and second sides of said polymeric film material are respectively the sides of said first and second polymeric film sheets opposite to said interface.

7. The element of claim 6 wherein said second polymeric film sheet is transparent, and comprises a white coating forming said white outermost surface of said second side.

8. The element of claim 7 wherein the image is a halftone image comprising halftone dots.

9. The element of claim 6 wherein said second polymeric film sheet is white throughout its entirety.

10. The element of claim 9 wherein the image is a halftone image comprising halftone dots.

11. The element of claim 6 wherein the image is a halftone image comprising halftone dots.

12. The element of claim 1 wherein the image is a halftone image comprising halftone dots.

13. An image-bearing element which comprises a white translucent, metallized article, wherein the article comprises a flexible, heat resistant, polymeric film material having deposited on one side thereof a metal coating which is both light reflective and light transmissive in the visible region of the spectrum, wherein said metal coating has a thickness of from about 10 angstroms to about 200 angstroms, a specular gloss of from about 90 or more, and is capable of transmitting from about 1% to about 70% of incident visible light cast thereon; and wherein the side of the metal coating opposite from the polymeric film material has a white surface thereon, said white surface having a visible light opacity of from about 0.5 to about 0.98, and having an image on the white surface on the metal coating.

14. The element of claim 13, wherein the white surface comprises a white coated layer on the metal coating.

15. The element of claim 14 wherein the image is a halftone image comprising halftone dots.

16. The element claim 13 wherein the white surface comprises a white polymeric film sheet.

17. The element of claim 16 further comprising an adhesive between the metal coating and the white polymeric film sheet.

18. The element of claim 17 wherein the image is a halftone image comprising halftone dots.

19. The element of claim 16 wherein the image is a halftone image comprising halftone dots.

20. The element of claim 14 wherein the image is a halftone image comprising halftone dots.

\* \* \* \* \*